METHOD OF MANUFACTURING ELECTRICAL INTRACONNECTORS

Filed Aug. 1, 1966

INVENTORS.
WILLIAM P. DUGAN,
EUGENE G. FREEHAUF,

By L E Carnahan

AGENT.

3,429,038

METHOD OF MANUFACTURING ELECTRICAL INTRACONNECTORS

William P. Dugan and Eugene G. Freehauf, Ontario, Calif., assignors to General Dynamics Corporation, Pomona, Calif., a corporation of Delaware Filed Aug. 1, 1966, Ser. No. 569,259
U.S. Cl. 29—625 9 Claims
Int. Cl. H05k *3/06, 3/34;* D23p *17/00*

ABSTRACT OF THE DISCLOSURE

A method for fabricating a multi-layer circuit board having nickel tubular members integral with circuits encased within the board.

Devices which serve as a media for attaching electronic components to a circuit in single-layer and multi-layer apparatus are known. The end result of such devices is a series of circuits on a carrier board with tubular members at appropriate places in continuity with these circuits. The function of these tubular members is to receive electronic component leads so that they may be connected to the circuits as used in module construction, for example, U.S. Patent 3,209,066 and applicants' copending U.S. applications Ser. No. 408,283, now Patent No. 3,370,351, and Ser. No. 413,689, now Patent No. 3,396,459, illustrate single-layer or multi-layer carrier boards of the above described type.

While the above referenced electrical connectors provide numerous advantages over the previous types of connection devices utilized in the art, these tubular type connector systems have a disadvantage which is overcome by this invention. This disadvantage being in the location of a circuit on the carrier board which may be contacted by the component if the component lead is inserted sufficiently far into the tubular member, thereby causing possible shorting of the component or other adverse effects on the overall system.

The end result of this invention is a single-layer or multi-layer circuit board with tubular members at appropriate places in continuity with the circuits thereof. The function of these tubular members is to receive electronic component leads so that they may be connected to the circuit without possibility of the component itself contacting the circuit and thereby producing undesirable effects.

Carrier boards made in accordance with this invention have the following advantages:

(1) The tubular members are manufactured as an integral part of the carrier board.

(2) There is no chance of mismatch between the hole in the carrier board and the tubular members as they are one and the same.

(3) No "hard tooling" is necessary for limited production as all circuits and tubular member locations can be transposed directly from the engineering drawings.

(4) Tubular member height is easy to control because it originates from stable material and a variation in heights, for different applications, can be easily made.

(5) Tubular member diameters can be varied to accept different size component leads.

(6) Increases the number of circuits per given volume.

(7) Deletes the space consuming annulus thus increases the packaging density.

(8) Eliminates the silk screening operations utilized in prior methods.

(9) The base of the tubular members are flush with the circuit board.

(10) Can be applied to single-layer or multi-layer circuits.

(11) Circuits are completely encased eliminating contamination and electrical interference.

Therefore, it is an object of this invention to provide a method of fabricating electrical connectors.

A further object of the invention is to provide a method of fabricating devices which serve to intraconnect electronic component leads with single or multi-layer circuits.

Another object of the invention is to provide a method of manufacturing carrier boards having integral circuits and tubular connector members.

Another object of the invention is to provide a circuit board having the circuits thereof encased, thus eliminating contamination and electrical interference.

Other objects of the invention will become apparent from the following description and accompanying drawings wherein.

Figure 1:
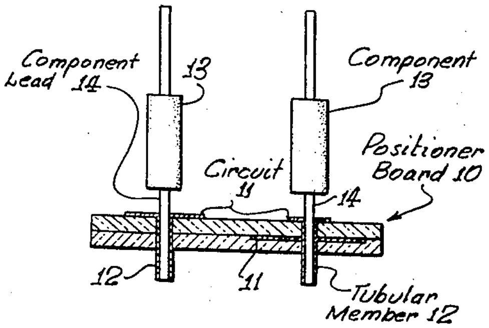
FIG. 1 is a view illustrating a carrier board with integral tubular members and circuits made by prior methods.

Referring now to the drawings, FIG. 1 illustrates an application of a multi-layer positioner board 10 made by prior methods. Connected to circuits 11 integral with board 10 via integral tubular members 12 are components 13 wherein the leads 14 of the components 13 extend into the tubular members 12 where they are welded or soldered to provide electrical and mechanical interconnection as known in the art. Note that the circuits 11 on the upper surface of board 10 are exposed and also are subject to being contacted by the body portion of components 13 should the leads 14 be inadvertently passed too far through the tubular members 12 during assembly operations.

Figure 2:
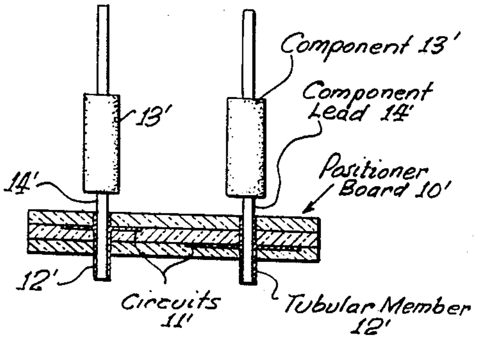
FIG. 2 is a view illustrating an embodiment of a carrier board made in accordance with the invention.

As shown in FIG. 2, the positioner board 10' made in accordance with this invention is provided with integral circuits 11' and tubular members 12' which are interconnected with components 13' via leads 14' similar to the FIG. 1 embodiment except that the upper circuit 11' is not exposed and the tubular member 12', at the upper end thereof, is flush with or slightly below the upper surface of the positioner board 10'. Thus, the possibility of contact between the components 13' and the circuits 11', and contamination of or electrical interference with circuits 11' is substantially reduced or eliminated.

Figure 3:
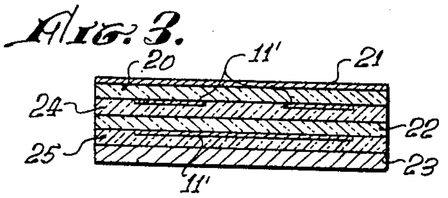
FIGS. 3–9 illustrate various steps of the inventive method.

The sequence of the primary steps for the manufacturing of an embodiment of the novel positioner board, as partially illustrated by FIGS. 3–9, is as follows:

(1) Bond together a sheet 20 of glass epoxy board with etched circuits 11' on one side and a copper layer 21 on the opposite side, a sheet 22 of glass epoxy board with an etched circuit 11' on one side, and a sheet 23 of aluminum having a thickness of the desired height of the protruding portion of the tubular elements 12', using two layers 24 and 25 of "B" stage epoxy glass laminate, as shown in FIG. 3.

Figure 4:
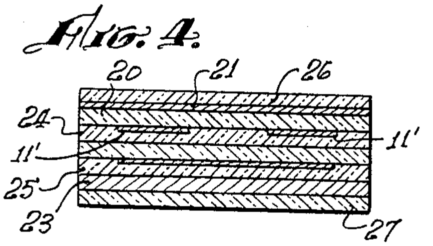
Figure 5:
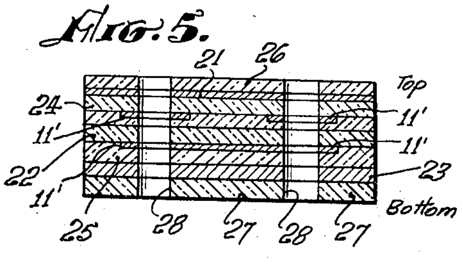

(2) Bond sheets 26 and 27 of glass epoxy board or equal material to the thus bonded assembly, as shown in FIG. 4, using double back adhesive tape. The sheets 26 and 27 and the tape may be replaced with a film of plastic if desired.

(3) Drill holes 28 (approximately 0.014 larger than the diameter of the desired associated component lead) through the bonded assembly at those places requiring a tubular member 12'.

(4) Electro-copper plate all exposed aluminum surfaces to a thickness of about 0.0002 inch.

(5) Electroless copper plate all surfaces to approximately 0.0001 inch thickness.

(6) Remove the copper plate from the top and bottom surfaces of the assembly, such as by suitable mechanical procedures.

(7) Electro-copper plate all metallic surfaces to a thickness of about 0.0015 inch.

(8) Electroplate with nickel all exposed copper surfaces to achieve a tubular member wall thickness of about 0.004 inch.

Figure 6:
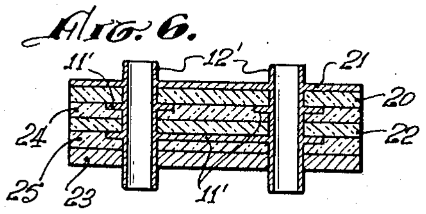

(9) Remove both epoxy boards 26 and 27 and any remaining adhesive from the tape, as shown in FIG. 6.

Figure 7:
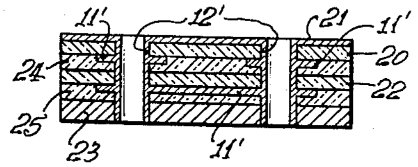

(10) Finish the tubular members 12' flush with the surface of copper layer 21 and the surface of aluminum sheet 23 (see FIG. 7).

Figure 8:
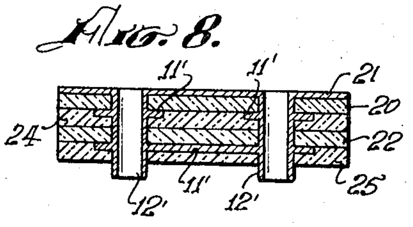

(11) Diss›lve the aluminum sheet 23 by immersing in sodium hydroxide leaving the lower ends of tubular members 12' extending from the epoxy layer 25 (see FIG. 8).

Figure 9:
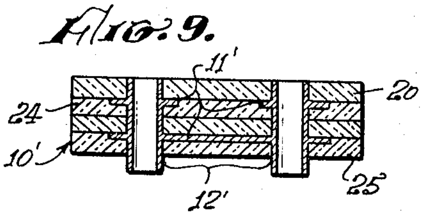

(12) Remove copper 21 from clad board 20 and around tubular members 12' by immersing in copper stripper, thus leaving the upper ends of the tubular members 12' flush with or slightly recessed from the upper surface of board 10', as shown in FIG. 9.

While not set forth, appropriate rinses in accordance with known practices are utilized during the process.

The end result as shown in FIG. 2 or FIG. 9 is a multi-layer circuit board having integral nickel tubular members which are integral with combination copper and nickel circuits which are encased within the positioner boards. Several layers can be made by the addition of combinations of layers 20, 22, 24 and 25.

It has thus been shown that this invention produces a circuit board having integral tubular connector members which have the same advantages as the prior boards of this type but overcome the disadvantages; namely, the exposure of the circuits therein.

Although particular embodiments, materials and thicknesses have been set forth, modifications and changes will become apparent to those skilled in the art, and it is intended to cover in the appended claims all such modifications and changes as come within the true spirit and scope of the invention.

What we claim is:

1. A method of manufacturing electrical connectors of the type having an integral positioner board, at least one circuit within the positioner board, and at least one tubular member comprising the sequential steps of: bonding together a layer of insulation material having at least one circuit on one side and a layer of copper on the opposite side, a layer of insulation material with at least one circuit on one side, and a layer of aluminum having the same thickness as the height of the desired tubular members, using a suitable bonding material to form a plurality of layers consisting from top to bottom of a layer of copper, a layer of insulation material, circuit, a layer of bonding material, a layer of insulation material, circuit, a layer of bonding material, and a layer of aluminum; bonding a layer of suitable material to the top and bottom surfaces of the previously bonded assembly; forming holes of predetermined position, diameter, and number through the thus bonded assembly; electro-copper plating all of the exposed aluminum surfaces to a desired thickness; electroless copper plating all surfaces to a desired thickness; removing the copper plating from the top and bottom surfaces of the bonded layer assembly; electro-copper plating all metallic surfaces to a desired thickness, electroplating with nickel all exposed copper surfaces to a thickness of the desired tubular member wall thickness; removing the top and bottom layers and any remaining adhesive utilized to bond the top and bottom layers to the assembly; finishing the ends of the tubular members so as to be substantially flush with the remaining external surfaces of the bonded layer assembly; dissolving the layer of aluminum from the bottom of the bonded assembly; and removing copper from the top surface of the assembly and from the tubular members.

2. The method defined in claim 1, wherein the insulation material and the suitable bonding material of the first mentioned step are glass epoxy board and "B" stage epoxy glass material respectively; and wherein the layer of suitable material bonded to the top and bottom surfaces of the previously bonded layers is a glass epoxy material bonded by a double back adhesive tape.

3. The method defined in claim 1, wherein the step of forming holes through the thus bonded layer assembly is accomplished by drilling apertures therethrough having a diameter about 0.014 inch larger than the desired diameter of an associated component lead to be utilized therewith.

4. The method defined in claim 1, wherein the electro-copper plating step of all of the aluminum surfaces is accomplished by plating the exposed aluminum surfaces to a thickness of about 0.0002 inch.

5. The method defined in claim 1, wherein the electroless copper plated surfaces are plated to a thickness of about 0.0001 inch.

6. The method defined in claim 1, wherein the electro-copper plating of all metallic surfaces is plated to a thickness of about 0.0015 inch.

7. The method defined in claim 1, wherein the nickel is plated to a thickness of about 0.004 inch.

8. The method defined in claim 1, wherein the step of dissolving the layer of aluminum from the bottom of the bonded assembly is accomplished by immersing in sodium hydroxide.

9. The method defined in claim 1, wherein the last mentioned step is accomplished by immersing in a suitable copper stripper.

References Cited

UNITED STATES PATENTS

| | | | |
|---|---|---|---|
| 3,040,426 | 6/1962 | Hamren. | |
| 3,102,213 | 8/1963 | Bedson et al. | 317—101 X |
| 3,163,588 | 12/1964 | Shortt et al. | 29—625 X |
| 3,261,769 | 7/1966 | Coe et al. | |
| 3,345,741 | 10/1967 | Reimann | 29—626 |
| 3,357,099 | 12/1967 | Nagy et al. | 29—625 |

JOHN F. CAMPBELL, *Primary Examiner.*

D. C. REILEY, *Assistant Examiner.*

U.S. Cl. X.R.

29—423, 527, 626